(12) United States Patent
Evans

(10) Patent No.: US 6,781,139 B2
(45) Date of Patent: Aug. 24, 2004

(54) LOAD LOCK VACUUM CONDUCTANCE LIMITING APERTURE

(75) Inventor: Morgan D. Evans, Manchester, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 10/254,229

(22) Filed: Sep. 25, 2002

(65) Prior Publication Data

US 2004/0056213 A1 Mar. 25, 2004

(51) Int. Cl.$^7$ .......................... H01J 37/18; B65G 1/133
(52) U.S. Cl. .................. 250/492.21; 250/492.2; 250/441.11; 414/217; 414/935; 414/939
(58) Field of Search .................. 250/492.21, 441.11; 414/217, 935, 939

(56) References Cited

U.S. PATENT DOCUMENTS 6,530,732 B1 * 3/2003 Theriault et al. ........... 414/217
6,543,981 B1 * 4/2003 Halsey et al. ............ 414/217.1

* cited by examiner

*Primary Examiner*—John R. Lee
*Assistant Examiner*—James J. Leyvourne

(57) ABSTRACT

An apparatus in combination with a load lock of an ion implanter comprises a cover adjacent an isolation valve slot of the load lock. The cover defines an aperture generally conforming to the size and shape of the load, or wafer, within the load lock with sufficient clearance for a robot arm to pick the wafer from within the load lock and transfer the wafer to the implant chamber. The cover masks a portion of the slot so as to reduce the opening between the load lock and the implant chamber of the ion implanter. The smaller opening reduces the pressure burst from the load lock to the implant chamber when the isolation valve and slot is opened. By reducing the pressure burst, the cover can shorten the recovery time for the implant chamber to reach operating pressure.

22 Claims, 2 Drawing Sheets

LOAD LOCK VACUUM CONDUCTANCE LIMITING APERTURE

RELATED APPLICATIONS

There are no related applications.

1. Field

The methods and systems relate to semiconductor wafer processing, and more particularly to load lock apertures used in wafer processing.

2. Background

A large variety of materials can be used in the production of wafer cassettes, with particular materials being used to meet various goals including particulate control, static discharge reduction, weight, cost and dimensional stability. While a particular material choice may achieve its goal, it may have negative effects on other aspects of wafer processing. For example, plastic cassettes or photoresist on a wafer can exhibit many structural properties that make their use desirable, however they may have negative effects on the vacuum needed during wafer processing.

In addition, the photoresist on wafers can present a large gas load to the vacuum system. High and repeatable vacuum may be required in ion implanters during wafer processing to assure correct dose repeatability and uniformity as well as to maintain throughput of the implanter or tool, i.e., the number of wafers that may be processed over a given time. In adopting new cassette or photoresist materials, such as polycarbonate, in order to improve particulate control and/or dimensional stability, end users of such equipment may not realize that the vacuum system, including the load lock and isolation valve, may need to be reconfigured to maintain tool performance.

In a typical semiconductor wafer processing system, a wafer cassette, with wafers that may or may not have photoresist masked onto them, may be loaded into a load lock station in preparation for transferring the wafers to a processing, or implant, chamber. A load lock vacuum pump can be used to bring down the pressure in the load lock to a level consistent with the implant chamber vacuum. The load lock may then be opened to the implant chamber and the wafer transferred into the chamber. In some instances, opening the load lock may result in a pressure burst in the chamber, such that a vacuum recovery period may be required to return the pressure within the chamber to levels acceptable for implanting, i.e., levels where the desired process parameter, such as implant dose repeatability, uniformity, energy contamination and/or tool throughput, can be achieved. Thus, the time to first implant, i.e., the time from the start of load lock pump down until implanting may be started can include a load lock pump down time and a process chamber vacuum recovery time.

A load lock isolation valve can be used to isolate the load lock from the implant chamber during load lock pump down. Opening of the valve can allow access to the load, or wafer in the load lock. The valve can be configured to provide an opening through which the wafer may pass. Such openings can be rectangular, circular, or ellipsoid, and may typically extend well beyond the width of the wafer in the load lock and may also extend to a greater height than the full height of the wafer and pick used to handle the wafer. As an example, the opening for a VIISta 810 HP implanter, as manufactured by Varian Semiconductor Equipment Associates of Gloucester, Mass., may be approximately 7 cm×33 cm, while the wafer that passes through the opening may have a diameter of 30 cm and may have a thickness of less than 1 mm. When opened, the relatively large opening can produce a correspondingly large pressure burst in the implant chamber. The process chamber vacuum recovery time may correspondingly be extended, thus adversely impacting the throughput of the implanter, as well as the quality of the implant.

SUMMARY

According to the systems and methods described herein, an apparatus in combination with a load lock of an ion implanter comprises a cover adjacent a slot of the load lock, the cover defining an aperture to provide access to a load within the load lock. The cover covers a portion of the slot so as to reduce the opening between the load lock and an implant chamber of the ion implanter and thus reduce a pressure burst between the load lock and the implant chamber. In one embodiment, the cover may cover a portion of an opening between two chambers to reduce the pressure burst between the chambers. The cover may define an aperture between the two chambers that can maintain access for movement of a load between the two chambers.

The depth of the cover, as measured in a direction normal to slot, or opening, may be maximized to provide further reduction in the pressure burst. The apparatus may be removably attached to the load lock or the implant chamber, or to one of the two chambers. The size of the aperture may be reduced to the minimum required to maintain clearances for handling the wafer or load between the load lock and the implant chamber, or between the two chambers. Thus, the method for reducing a pressure burst between two chambers, such as a load lock and an implant chamber, may comprise covering a slot of the load lock with a cover having an aperture therethrough, minimizing a size of the aperture to maintain access to a load for moving the load between the load lock and the vacuum chamber and maximizing a depth of the cover measured in a direction normal to the slot of the load lock.

BRIEF DESCRIPTION OF THE DRAWINGS

The following figures depict certain illustrative embodiments of the systems and methods in which like reference numerals refer to like elements. These depicted embodiments are to be understood as illustrative and not as limiting in any way.

DETAILED DESCRIPTION OF THE PREFERRED EMBODIMENT

Figure 1:
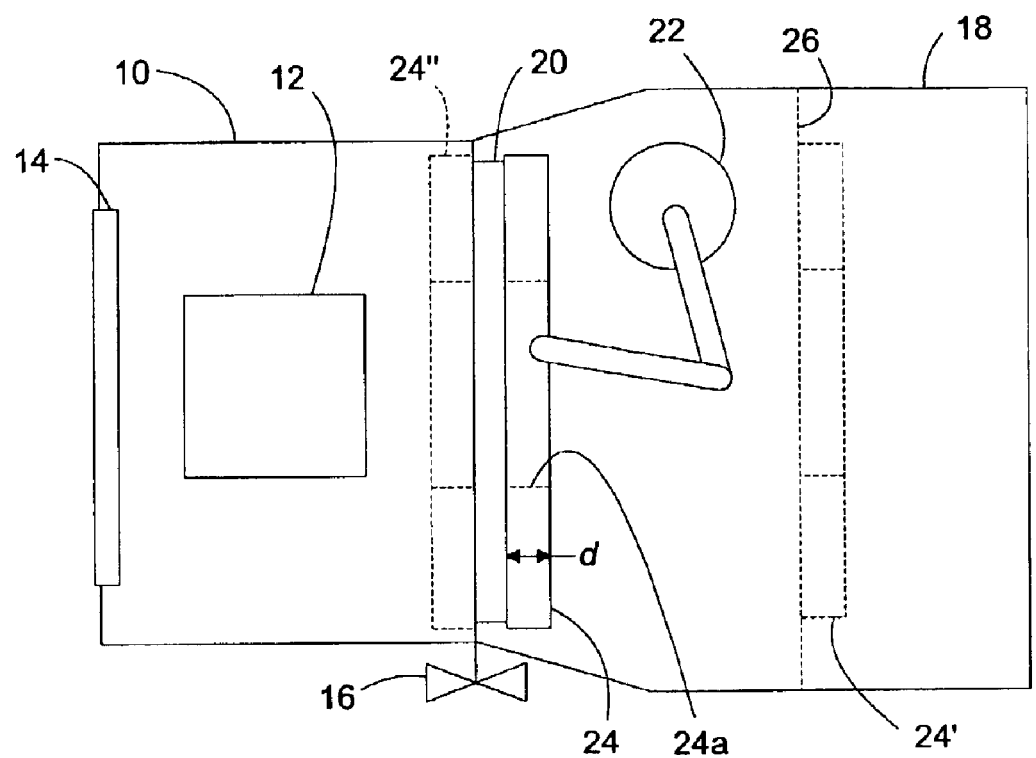
FIG. 1 may depict a schematic representation of an ion implanter load lock with a vacuum conduction limiting aperture.

Referring now to FIG. 1, there may be shown a schematic representation of a load lock 10 of an ion implanter. A load 12 may be positioned within load lock 10 and load lock 10 may be closed such that load 12 may be isolated within load lock 10. Load 12 may then be brought from a first state to a second state. For the exemplary load lock 10, the load 12 may be a wafer, or a cassette of wafers, 12 that may be inserted into the load lock 10 through an insertion opening 14. The load lock 10 may be at a first pressure during the insertion, referred to herein as ambient pressure. The wafer or wafer cassette 12 may be isolated, or sealed within load lock 10, by closing opening 14 and pump down of the load lock 10 can begin.

Pump down can continue for a predetermined pump down time, or until the pressure within load lock 10 has reached a predetermined set point pressure. After the pump down time, or when the lock set point may be reached, the isolation valve 16 can be opened to expose the load 12 to the implant chamber 18. Isolation valve may be configured to open slot 20, through which load 12 may be accessed by wafer handling robot 22. Robot 22 may pick load, or wafer 12 from within load lock 10 and place wafer 12 into position within implant chamber 18 for processing. As noted previously, slot 20 may be wider than wafer 12 and may have a height on the order of 50- to 100-times the thickness of wafer 12. Pressure differences between the load lock 10 and the implant chamber 18 may result in pressure or gas bursts when the isolation valve 16 and slot 20 may be opened.

Figure 2:
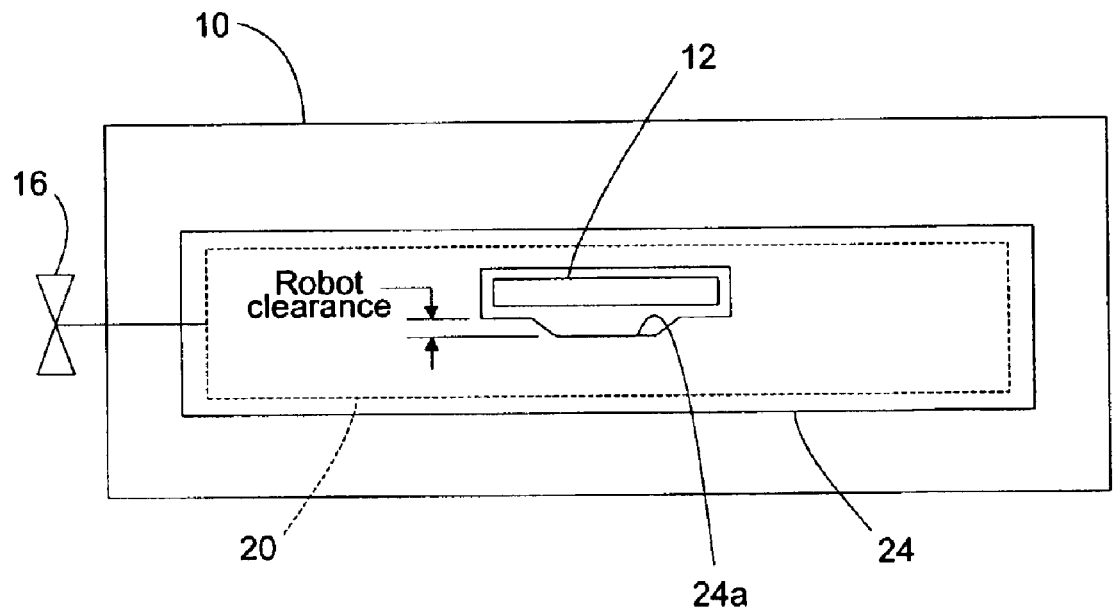
FIG. 2 may depict a schematic elevation view of the load lock of FIG. 1.

Referring now to FIG. 2, there is shown a schematic elevation view of load lock 10, wherein isolation valve 16 may be open, such that load 12 may be seen in load lock 10 through slot 20. Cover 24 may be placed over slot 20, between load lock 10 and implant chamber 18. Cover 24 may define an aperture 24a, which may more closely conform to the wafer 12 dimensions and may include clearance for robot 22 to pick wafer 12 from within load lock 10. By reducing the opening between load lock 10 and implant chamber 18, cover 24 can reduce the gas burst into implant chamber 18 when isolation valve 16 and slot 20 may be opened.

It can be understood that the configuration of cover 24 and aperture 24a may be varied to suit the equipment and processes with which it can be used. For example, some implanters may include a wafer handling chamber 26, indicated in phantom in FIG. 1, intermediate between the load lock 10 and the implant chamber 18. As indicated in FIG. 1, the robot 22 may be within the wafer handling chamber 26. In some implanters, the wafer handling chamber 26 may be open to implant chamber 18, such that a pressure burst can occur between the load lock 10 and the wafer handling chamber 26. In other implanters, the wafer handling chamber 26 may be a separate vacuum space from the implant chamber 18, such that a pressure burst may occur between the load lock 10 and the wafer handling chamber 26 and also between the wafer handling chamber 26 and the implant chamber 18.

Those of skill in the art can realize that the cover 24 with aperture 24a may be placed between two chambers where a gas burst may occur when one chamber may be opened to the other. Thus, when wafer handling chamber 26 may be a separate vacuum space, a cover 24 with aperture 24a may be positioned between load lock 10 and wafer handling chamber 26 and also between wafer handling chamber 26 and implant chamber 18, as shown in phantom at 24'. Wherever cover 24 may be positioned, the size of the aperture 24a may be minimized to provide the greatest reduction in the pressure burst between the two chambers, while maintaining clearances for the wafer and handling robot, or other wafer handling means.

Figure 3:
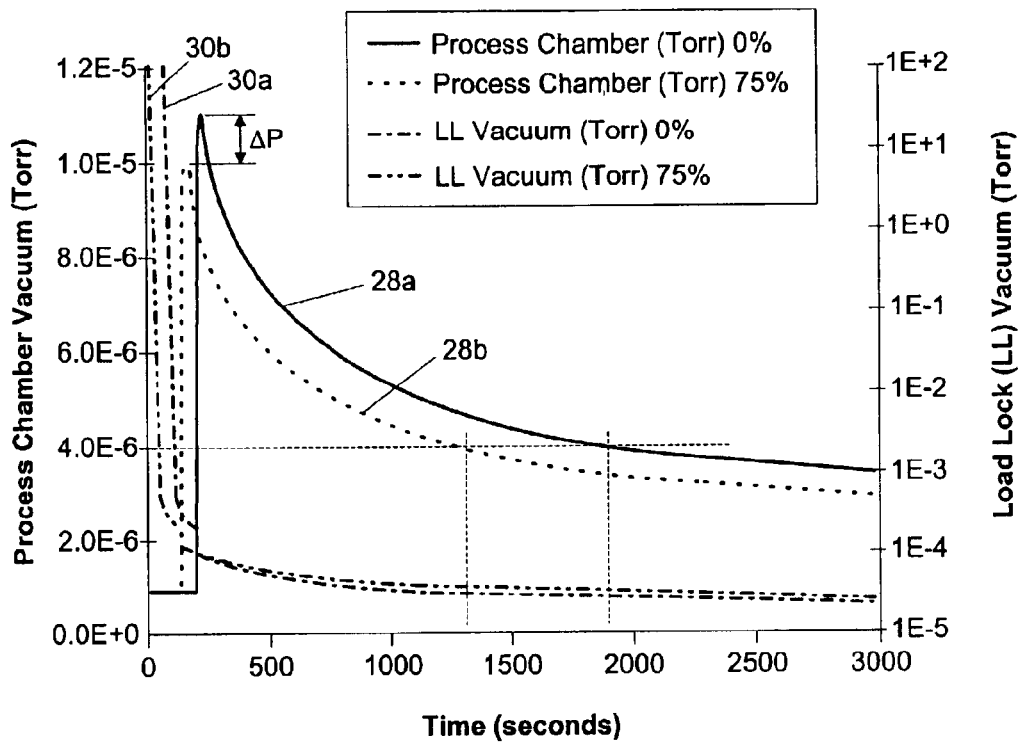
FIG. 3 may depict a plot of load lock pump down curves and implant chamber pressure curves.

The effects of cover 24 on the load lock 10 pump down and the implant chamber 18 pressure may be illustrated in FIG. 3. FIG. 3 may show implant chamber pressure curves 28a and 28b and load lock pump down curves 30a and 30b for load lock 10 and implant chamber 18 with and without cover 24 in place, respectively. For the cover 24 illustrated in FIG. 2, aperture 24a may have an area approximately 25% that of slot 20, i.e., cover 24 may block approximately 75% of slot 20. Referring to implant chamber pressure curves 28a and 28b, it can be seen that the reduced area of aperture 24a can result in a reduced pressure burst, indicated as $\Delta P$ in FIG. 3, between curve 28a without cover 24 and curve 28b with cover 24 in place. Depending on the operating pressure chosen, the time to implant, i.e., the time for pump down of load lock 10 plus the recovery time for the implant chamber 18 to return to the operating pressure, may be reduced approximately 25% to 30%. For an example operating pressure of $4.0E^{-6}$, the time to implant for curve 28a (without cover 24) can be seen to be approximately 1800 seconds, while the time to implant for curve 28b (with cover 24 in place) can be seen to be about 1325 seconds.

Figure 4:
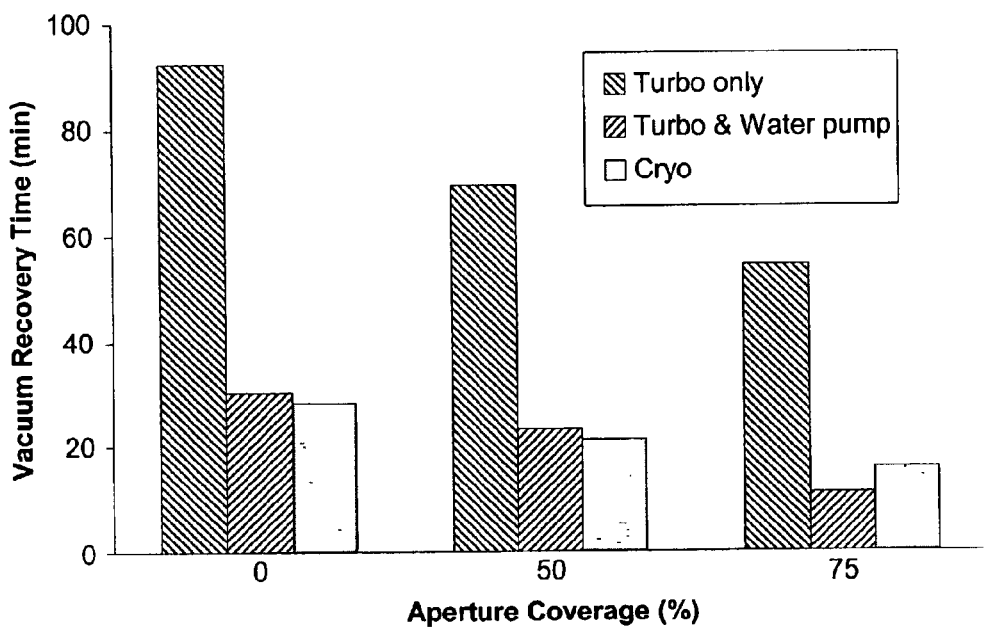
FIG. 4 may depict a plot of vacuum recovery times.

FIG. 4 may show the results of tests conducted with cover 24 blocking 50% and 75% of the slot 20 for three different pump configurations, i.e., a turbomolecular pump (TMP), a cryo pump (CP) and a combination turbomolecular/water pump (WP), for pumping down the load lock 10. FIG. 4 can show a roughly linear relationship between the percent slot reduction and the vacuum recovery time for all three configurations. The vacuum recovery time improvement and, by extension, tool throughput, can be seen to be greatest for the TMP configuration and least for the CP configuration, though the percentage change for all three configurations may be in the range of 40% to 60%. Further restriction of the opening between the load lock 10 and the implant chamber 18, and thus, further reduction in the pressure burst, can be achieved by increasing the depth, d, of cover 24, shown in FIG. 1. The maximum depth, d, may be constrained by wafer handling requirements, such as clearances about the wafer or wafer cassette, pick clearances, etc.

While the methods and systems have been disclosed in connection with the preferred embodiments shown and described in detail, various modifications and improvements thereon will become readily apparent to those skilled in the art. Cover 24 may be of a material compatible with and sufficient to withstand the production process being used. The cover 24 may be removably or permanently attached to load lock 20. By the use of a removable cover 24, cover 24 can be changed to suit the wafer and robot configuration of the production process being used. This can provide increased flexibility for future changes when compared to a cast in place load lock aperture.

In one embodiment, cover 24 may have an adjustable aperture 24a, such that cover 24 may remain in place and the aperture may be changed when the wafer and/or robot configuration may be changed. Aperture adjustment can be by means as may be known in various fields of art and that can be adapted for use with a load lock 10, such as, but not limited to, camera aperture adjustment means and ion beam aperture adjustment means. Further, cover 24 may be retrofit to existing equipment. The use of cover 24 may also allow for greater machine or casting tolerances in the fabrication of load lock 10, wafer handler 22 and/or process chamber 18, as the cover 24 can provide for required tolerances.

Alternatively, cover 24 may be attached to implant chamber 18 in lieu of being attached to load lock 10. For the exemplary embodiment of FIGS. 1 and 2, cover 24 can be seen to be located on the outside surface of load lock 10. However, there may be equipment configurations where cover 24 may be located within load lock 10, as illustrated by cover 24", shown in phantom in FIG. 2. Those of skill in the art may realize that cover 24 may be removably or permanently attached between various chambers where a pressure burst can occur, such as between a wafer handler chamber and an adjacent chamber, as previously described.

The aforementioned variations may be merely illustrative and not exhaustive, and other changes can be implemented. Accordingly, many additional changes in the details and arrangement of parts, herein described and illustrated, can be made by those skilled in the art. Thus, the arrangement of the components shown in the figures may be merely for illustrative purposes and can be varied to suit the particular implementation of interest. Accordingly, items may be combined, expanded, or otherwise reconfigured without departing from the scope of the disclosed system. It will thus be understood that the following claims may not to be limited to the embodiments disclosed herein. The claims can include practices otherwise than specifically described and are to be interpreted as broadly as allowed under the law.

What is claimed is:

1. An apparatus in combination with a load lock of an ion implanter, comprising a cover adjacent a slot of the load lock, the cover defining an aperture to provide access to a load within the load lock, the cover covering a portion of the slot so as to reduce an opening between the load lock and an implant chamber of the ion implanter to the size defined by the aperture for protecting the load by minimizing pressure bursts when transferring the load from the load lock to the implant chamber.

2. The apparatus of claim 1, wherein the cover is attached to the load lock.

3. The apparatus of claim 2, wherein the cover is removably attached to the load lock.

4. The apparatus of claim 1, wherein a dimension of the cover in a direction normal to the slot is maximized.

5. The apparatus of claim 4, wherein a size of the aperture is adjustable.

6. The apparatus of claim 4, wherein a size of the aperture is a minimum required to maintain clearances for handling the load between the load lock and the implant chamber.

7. The apparatus of claim 6, wherein the cover is attached to the load lock.

8. The apparatus of claim 7, wherein the cover is removably attached to the load lock.

9. The apparatus of claim 1, wherein a size of the aperture is adjustable.

10. The apparatus of claim 1, wherein a size of the aperture is a minimum required to maintain clearances for handling the load between the load lock and the implant chamber.

11. A cover for an opening between two chambers of different pressures, the cover covering a portion of the opening between the two chambers so as to reduce a pressure burst between the two chambers, the cover defining an aperture for reducing the opening between the two chambers to maintain access for movement of a load between the two chambers.

12. The cover of claim 11, wherein the cover is attached to one of the chambers.

13. The cover of claim 12, wherein the cover is removably attached to one of the chambers.

14. The cover of claim 11, wherein a dimension of the cover in a direction normal to the opening is maximized.

15. The cover of claim 14, wherein a size of the aperture is adjustable.

16. The cover of claim 14, wherein a size of the aperture is a minimum required to maintain clearances for handling the load between the two chambers.

17. The cover of claim 16, wherein the cover is attached to one of the chambers.

18. The cover of claim 17, wherein the cover is removably attached to the one chamber.

19. The cover of claim 11, wherein a size of the aperture is adjustable.

20. The cover of claim 11, wherein a size of the aperture is a minimum required to maintain clearances for handling the load between the two chambers.

21. A method for reducing a pressure burst between a load lock and a vacuum chamber of an ion implanter, comprising:
    covering a slot of the load lock with a cover having an aperture therethrough;
    minimizing a size of the aperture to maintain access to a load for moving the load between the load lock and the vacuum chamber; and
    maximizing a depth of the cover measured in a direction normal to the slot of the load lock.

22. An apparatus in combination with a plurality of chambers of an ion implanter, comprising:
    a plurality of covers, each of said covers adjacent to a slot of one of the chambers; and
    a plurality of apertures corresponding to each of the covers, the apertures providing access to a load within the chambers;
    wherein the covers covering a portion of the slots so as to reduce an opening between the chambers to the size defined by the apertures for protecting the load by minimizing pressure bursts when transferring the load between the chambers.

* * * * *